(12) United States Patent
Inui

(10) Patent No.: US 9,190,439 B2
(45) Date of Patent: Nov. 17, 2015

(54) SOLID-STATE IMAGE PICKUP DEVICE

(71) Applicant: CANON KABUSHIKI KAISHA, Tokyo (JP)

(72) Inventor: Fumihiro Inui, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/606,907

(22) Filed: Jan. 27, 2015

(65) Prior Publication Data

US 2015/0214260 A1      Jul. 30, 2015

(30) Foreign Application Priority Data

Jan. 30, 2014  (JP) .................................. 2014-016021

(51) Int. Cl.
*H01L 27/00*   (2006.01)
*H01L 27/146*  (2006.01)

(52) U.S. Cl.
CPC ...... *H01L 27/14612* (2013.01); *H01L 27/1463* (2013.01); *H01L 27/14641* (2013.01)

(58) Field of Classification Search
CPC ............ H01L 27/146; H01L 27/14603; H01L 27/13609; H01L 27/1461; H01L 27/14641; H01L 27/1463
See application file for complete search history.

(56) References Cited

U.S. PATENT DOCUMENTS

| | | | | |
|---|---|---|---|---|
| 5,386,108 | A * | 1/1995 | Arikawa et al. | 250/208.1 |
| 2011/0242381 | A1* | 10/2011 | Sakakibara et al. | 348/301 |
| 2013/0099291 | A1* | 4/2013 | Shimotsusa et al. | 257/225 |
| 2013/0181316 | A1* | 7/2013 | Tsukimura et al. | 257/443 |

FOREIGN PATENT DOCUMENTS

JP            2010-3995 A      1/2010

* cited by examiner

*Primary Examiner* — Nikolay Yushin
(74) *Attorney, Agent, or Firm* — Canon USA, Inc. IP Division

(57) ABSTRACT

One disclosed aspect of the embodiments relates to a solid-state image pickup device including a first semiconductor region, a second semiconductor region, a third semiconductor region, and a fourth semiconductor region of a same conduction type arranged in order along a first direction in an active region, and a first conduction pattern, a second conduction pattern, and a third conduction pattern provided above an active region disposed between the patterns and the semiconductor regions corresponding thereto with an insulating member interposed therebetween and electrically isolated from each other and arranged in order along the first direction. The first semiconductor region, the first conduction pattern, and the third semiconductor region constitute the transfer transistor. The first semiconductor region, the second conduction pattern, and the second semiconductor region constitute the additional capacitor, and the second semiconductor region, the third conduction pattern, and the fourth semiconductor region constitute the reset transistor.

20 Claims, 12 Drawing Sheets

SOLID-STATE IMAGE PICKUP DEVICE

FIELD OF THE INVENTION

One disclosed aspect of the embodiments relates to a solid-state image pickup device.

DESCRIPTION OF THE RELATED ART

A configuration for connecting an additional capacitor to a floating diffusion (hereinafter referred to as FD) for increasing the dynamic range is known as a conventional technique.

In Japanese Patent Application Laid-Open No. 2010-3995, in a high illumination region, a high sensitivity pixel is saturated with a lower illumination than other pixels, and a capacitive coupling transistor and an additional capacitor are inserted to cope with the lamination of the dynamic range. Therefore, in Japanese Patent Application Laid-Open No. 2010-3995, the capacitance can be divided, and the capacitance value is adjusted, so that the dynamic range at the high illumination side is increased.

SUMMARY OF THE INVENTION

One disclosed aspect of the embodiments relates to an image pickup device comprising multiple pixels, each pixel including a photoelectric conversion unit, an amplification transistor, a transfer transistor configured to transfer a signal of the photoelectric conversion unit to an input node of the amplification transistor, an additional capacitor configured to switch connection state and non-connection state for the input node, and a reset transistor configured to set a potential of the input node to a predetermined potential, wherein each of the pixels includes a third semiconductor region, a first semiconductor region, a second semiconductor region, and a fourth semiconductor region of a same conduction type arranged in this order along a first direction in an active region provided in a semiconductor substrate, and a first conduction pattern, a second conduction pattern, and a third conduction pattern provided above an active region in this order along the first direction, and the first semiconductor region, the first conduction pattern, and the third semiconductor region constitute the transfer transistor, the first semiconductor region, the second conduction pattern, and the second semiconductor region constitute the additional capacitor, and the second semiconductor region, the third conduction pattern, and the fourth semiconductor region constitute the reset transistor.

Further features of the disclosure will become apparent from the following description of exemplary embodiments (with reference to the attached drawings).

200 element isolation unit
201A active region
202 N-type semiconductor region (third semiconductor region)
203, 205, 207 conduction pattern
204 N-type semiconductor region (first semiconductor region)
206 N-type semiconductor region (second semiconductor region)
208 N-type semiconductor region (fourth semiconductor region)
214 transfer transistor
216 reset transistor

DESCRIPTION OF THE EMBODIMENTS

First Embodiment

Figure 1:
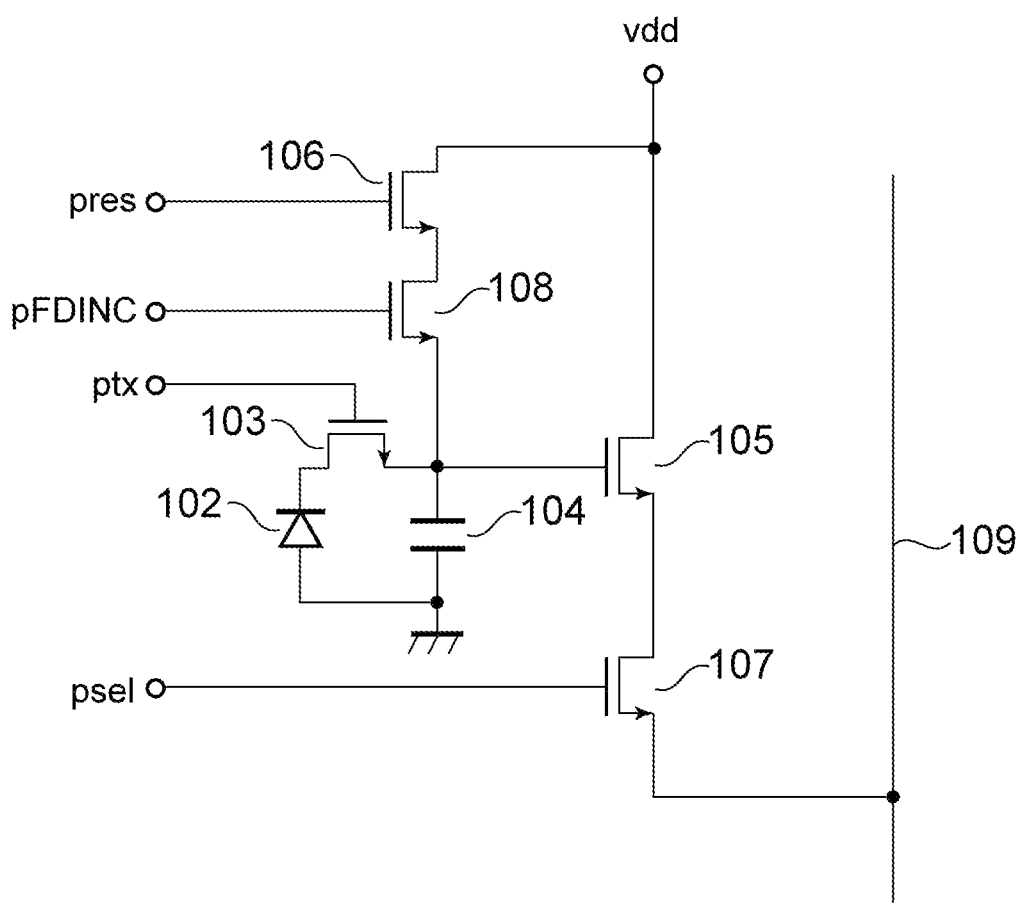
FIG. 1 is an example of an equivalent circuit diagram of a pixel of a solid-state image pickup device.

FIG. 1 illustrates an example of an equivalent circuit of a pixel of a solid-state image pickup device according to the present embodiment. Although only one pixel is shown here, multiple pixels are arranged in a two-dimensional manner in the solid-state image pickup device, so that they constitute a pixel arrangement. In the explanation about the present embodiment, signal electrical charge is electrons, and each transistor is an N-type transistor. However, the conduction-type is not limited thereto, and a P-type transistor may be used, and the signal electrical charge may be used as holes. This is also applicable to first and subsequent embodiments.

The photoelectric conversion unit generates as many as electrical charge pairs according to the incident light quantity by means of photoelectric conversion, and accumulates electrons. For example, the present embodiment uses a photo diode 102 as a photoelectric conversion unit.

The transfer unit transfers electrons of the photoelectric conversion unit. For example, in the present embodiment, a transfer transistor 103 is used as a transfer unit. A control pulse ptx is provided to the gate of the transfer transistor 103, so that the ON state and the OFF state are switched. The transfer transistor 103 transfers a signal of the photoelectric conversion unit to the input node of the amplification transistor explained later.

The electrical charge holding unit 104 holds electrons generated by the photoelectric conversion unit and transferred by the transfer unit. The electrical charge holding unit 104 is constituted by a capacitance including a floating diffusion region disposed on a semiconductor substrate. The floating diffusion region is constituted by an N-type semiconductor region.

The pixel amplification unit amplifies and outputs a signal on the basis of electrons transferred by the transfer unit. For example, in the present embodiment, an amplification transistor 105 is used as a pixel amplification unit. The gate of the amplification transistor 105 is electrically connected to the floating diffusion region. A predetermined voltage is provided to the drain of the amplification transistor 105. According to the connection relationship as described above, the amplification transistor 105 and an electric current source which is not shown constitute a source follower circuit. Then, electrons transferred to the floating diffusion region are converted into a voltage value in accordance with the quantity thereof, and the electric signal according to the voltage value is output to the outside of the pixel via the amplification transistor 105. Therefore, an electric node constituted by the gate of the amplification transistor 105 and the floating diffusion region is an input node of the amplification transistor 105. Then, this input node constitutes an electrical charge voltage conversion unit.

The pixel reset unit sets at least the potential of the floating diffusion region to a predetermined potential. For example, in the present embodiment, a reset transistor 106 is used as a pixel reset unit. The source of the reset transistor 106 is electrically connected to the floating diffusion region and the gate of the amplification transistor 105 via the additional capacitor 108 explained later. A predetermined voltage is provided to the drain of the reset transistor 106. Therefore, the reset transistor 106 sets the gate of the amplification transistor 105 and the potential of the floating diffusion region to a predetermined potential. The ON periods of the reset transistor 106 and the transfer transistor 103 partially overlap each other, so that the potential of the photoelectric conversion unit can be set to the reference potential. The control pulse pres is provided to the gate of the reset transistor 106, and the ON state and the OFF state of the reset transistor 106 are switched.

The selection unit controls output of the pixel signal to the signal line 109. With this selection unit, the signals of multiple pixels provided for a single signal line 109 can be output pixel by pixel or signals for multiple pixels can be output. For example, in the present embodiment, a selection transistor 107 is used as a selection unit. The drain of the selection transistor 107 is connected to the source of the amplification transistor 105, and the source of the selection transistor 107 is connected to the signal line 109. Instead of the configuration of the present embodiment, the selection transistor 107 may be provided between the drain of the amplification transistor 105 and the voltage wire receiving the predetermined voltage. In any case, the selection transistor 107 controls electrical connection between the amplification transistor 105 and the signal line 109. The gate of the selection transistor 107 receives the control pulse psel, whereby the ON state and the OFF state of the selection transistor 107 is switched.

The additional capacitor 108 is configured to be able to switch the connection state and the non-connection state with respect to the input node of the amplification transistor 105. In this case, a transistor of which any one of source and drain is connected to the floating diffusion region is used as an additional capacitor 108. According to a control pulse pFDINC provided to the gate of the transistor, the additional capacitor 108 can switch whether the region including the channel formed under the gate is to be used as a capacitance or not. With such switching operation, the input node of the amplification transistor 105 can be changed, and more specifically, the capacitance value added to the electrical charge holding unit 104 can be changed. When the capacitance value is increased by adding the additional capacitor 108 to the electrical charge holding unit 104, the number of electrons that can be held by the electrical charge holding unit 104 can be increased. More specifically, the dynamic range of the signal of the electrical charge holding unit 104 can be improved. When the additional capacitor 108 is not added not to the electrical charge holding unit 104, the electrical charge voltage conversion efficiency of the electrical charge holding unit 104 is improved. More specifically, even if the number of electrons is few, the voltage amplitude after the conversion is large, and therefore, the sensitivity under low illumination can be improved. Various subjects can be shot by using them upon switching the additional capacitor 108 in accordance with a reading mode.

Figure 2:
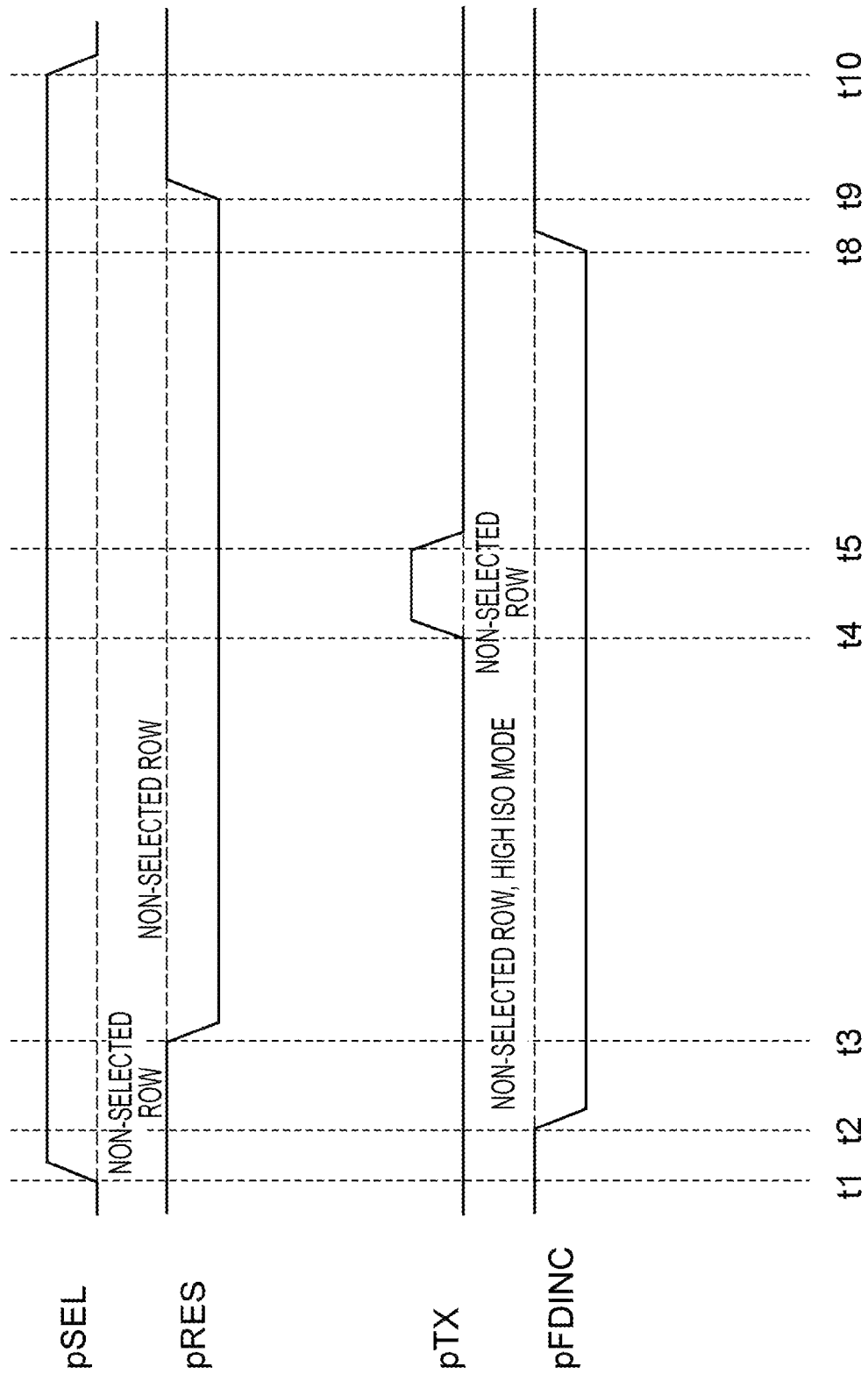
FIG. 2 is an example of a timing diagram of a solid-state image pickup device.

Subsequently, driving of the image pickup device of FIG. 1 will be explained with reference to FIG. 2. In FIG. 2, pSEL denotes a control pulse psel of the selection transistor of FIG. 1, and pRES denotes a control pulse pres of the reset transistor of FIG. 1. On the other hand, pTX denotes a control pulse ptx of the transfer transistor of FIG. 1, and pFDINC denotes a control pulse pFDINC of the transistor connected to the floating diffusion region of FIG. 1. When pFDINC is at a low level, the additional capacitor is added to the electrical charge holding unit, and when pFDINC is at a high level, the additional capacitor is not added to the electrical charge holding unit. When the control pulses except pFDINC is a pulse at a high level, the element is in a conductive state.

In the drawing, a solid line denotes a control pulse in a pixel to which the additional capacitor is added or in a mode to which the additional capacitor is added. A dotted line denotes a control pulse in a pixel to which the additional capacitor is not added, or in a pixel in the non-selection state, or in a mode to which the additional capacitor is not added.

First, at a time T=t1, the control pulse pSEL attains the high level. The control pulses pRES and pFDINC are at the high level, and the potential of the floating diffusion region constituting the electrical charge holding unit is a reference potential. Subsequently, at a time T=t2, the control pulse pFDINC attains the low level. Therefore, the additional capacitor 108 attains a state for being added to the electrical charge holding unit 104. Since pRES is at the high level, the electrical charge holding unit 104 and additional capacitor 108 attains a reference potential. Subsequently, at a time T=t3, the control pulse pRES attains the low level, and the reset operation of the potential of the electrical charge holding unit 104 and the additional capacitor is completed. At a time T=t4, the control pulse pTX attains the high level. At this occasion, the photoelectric conversion unit and the electrical charge holding unit 104 are in conductive state, and the electrons of the photoelectric conversion unit are transferred to the electrical charge holding unit 104. Since pFDINC is at the low level and the additional capacitor is in the state of being added to the electrical charge holding unit, the electrons transferred are accumulated in the electrical charge holding unit and the additional capacitor. At a time T=t5, the control pulse pTX attains the low level. Therefore, the photoelectric conversion unit and the electrical charge holding unit 104 are cut off. At a time T=t6, the control pulse pFDINC attains the high level. Accordingly, the additional capacitor attains a state of not being added to the electrical charge holding unit. At a time T=t7, the control pulse pRES attains the high level, so that the potential of the electrical charge holding unit 104 is reset. In a period T5-T8, the voltage of the signal line 109 is used as a signal (optical signal), so that a signal of a pixel in a state of having the additional capacitor added thereto can be used as an image signal.

Further, as necessary, in the period T3-T4, the voltage of the signal line 109 is used as a signal, so that a noise signal of the pixel can be obtained. The noise can be reduced by deriving the difference between the optical signal and the noise signal.

In the present embodiment, although the control pulse pSEL is kept at the high level at all times, it may be in the ON state only in the period in which the signal is read.

As described above, the capacitance is added to the electrical charge holding unit 104, whereby the capacitance value can be switched. Further, the reading mode may be switched for each pixel. In this case, for example, the added capacitance value may be switched for each color in a case of a sensor using a color filter.

Figure 3:
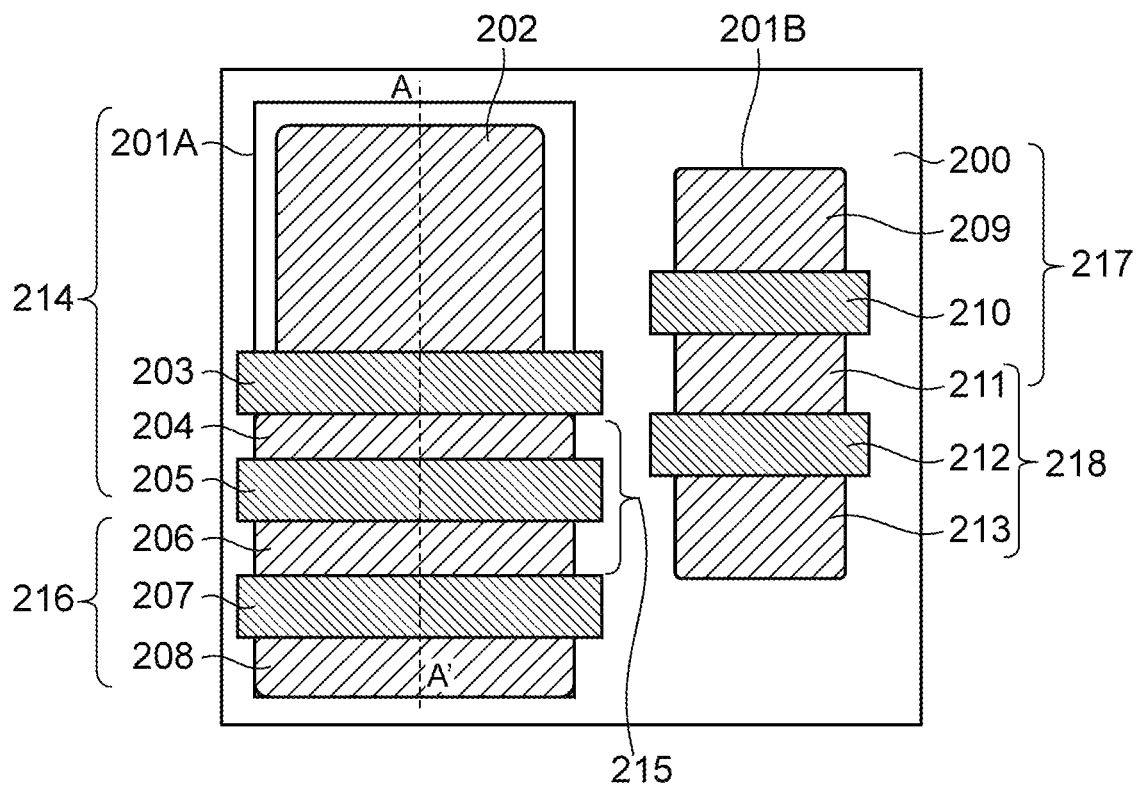
FIG. 3 is a top view schematically illustrating an example of arrangement of members constituting a pixel of a solid-state image pickup device according to a first embodiment.

FIG. 3 is a top view schematically illustrating an example of arrangement of members constituting a pixel of a solid-state image pickup device shown in FIG. 1, for example.

The active regions 201A, 201B are regions of which periphery is enclosed by the element isolation unit 200, and regions where at least some of constituent elements of the pixel are provided. The active regions 201A, 201B are separated from each other by the element isolation unit 200. In each active region, multiple N-type semiconductor regions are disposed. Multiple conduction patterns are disposed on the upper side of the active regions 201A, 201B with the insulating member interposed therebetween, and multiple conduction patterns are electrically separated from each other. These conduction patterns are members constituting the gate electrode of each transistor or a portion of an additional capacitor as explained later.

In the present embodiment, the conduction patterns disposed in the active region 201A and in the portion thereabove with the insulating member interposed therebetween constitute the photo diode 102, the transfer transistor 103, the additional capacitor 108, and the reset transistor 106 as shown in FIG. 1. The conduction patterns disposed in the active region 201B and in the portion thereabove with the insulating member interposed therebetween constitute the source region and drain region of the amplification transistor 105 and the selection transistor 107 shown in FIG. 1.

First, the active region 201A will be explained.

The N-type semiconductor regions 202, 204, 206, 208 are disposed in the active region 201A. These N-type semiconductor regions 202, 204, 206, 208 are arranged in this order along a direction extending from the upper portion to the lower portion of the drawing (first direction). The conduction patterns 203, 205, 207 are arranged above the active region 201A with the insulating member interposed therebetween. Likewise, these conduction patterns 203, 205, 207 are arranged in this order in the first direction. In the planar view, the N-type semiconductor region 202 (third semiconductor region), the conduction pattern 203 (first conduction pattern), the N-type semiconductor region 204 (first semiconductor region), the conduction pattern 205 (second conduction pattern), the N-type semiconductor region 206 (second semiconductor region), the conduction pattern 207 (third conduction pattern), and the N-type semiconductor region 208 (fourth semiconductor region) are arranged in this order along the first direction (predetermined direction). In this case, a part of each conduction pattern and each N-type semiconductor region may overlap each other in the planar view. However, each conduction pattern and each N-type semiconductor region should not be in such positional relationship that one of them is completely contained in other thereof in the planar view. In the planar view, each conduction pattern and each N-type semiconductor region does not have better other conduction pattern or other N-type semiconductor region disposed therebetween. However, an insulating member and/or a contact plug electrically connected to each N-type semiconductor region may be arranged between each conduction pattern. A P-type semiconductor region may be arranged between each N-type semiconductor region, or an N-type semiconductor region having an impurity concentration lower than that of the N-type semiconductor region may be arranged between the N-type semiconductor regions.

Therefore, in other words, the first conduction pattern 203, the second conduction pattern 205, and the third conduction pattern 207 arranged along the first direction are provided above the active region 201A with the insulating member interposed therebetween. The first semiconductor region 204 is arranged between the first conduction pattern 203 and the second conduction pattern 205 in the active region 201A. Further, the second semiconductor region 206 is arranged between the second conduction pattern 205 and the third conduction pattern 207 in the active region. In addition, the third semiconductor region 202 is arranged in the active region opposite to the first semiconductor region 204 with the first conduction pattern 203 interposed therebetween. The fourth semiconductor region 208 is arranged in the active region opposite to the second semiconductor region 206 with the third conduction pattern 207 interposed therebetween.

The third semiconductor region 202 constitutes the photo diode 102 by constituting a PN junction with the P-type semiconductor region explained later.

The transfer transistor 214 is constituted by the third semiconductor region 202, the first conduction pattern 203, and the first semiconductor region 204. The first conduction pattern 203 becomes the gate electrode of the transfer transistor 214. The first semiconductor region 204 is the floating diffusion region explained above, and is also the drain of the transfer transistor 214. This transfer transistor 214 corresponds to the transfer transistor 103 as shown in FIG. 1.

The additional capacitor 215 is constituted by the first semiconductor region 204, the second conduction pattern 205, and the second semiconductor region 206. According to the control pulse pFDINC provided to the second conduction pattern 205, it is possible to switch the state in which the additional capacitor is added to the electrical charge holding unit 104 and the state in which the additional capacitor is not added to the electrical charge holding unit 104, wherein the electrical charge holding unit 104 is an input node of the amplification transistor 105 as shown in FIG. 1. This additional capacitor 215 corresponds to the additional capacitor 108 as shown in FIG. 1.

The reset transistor 216 is constituted by the second semiconductor region 206, the third conduction pattern 207, and the fourth semiconductor region 208. The second semiconductor region 206 becomes the source of the reset transistor 216, and the fourth semiconductor region 208 becomes the drain of the reset transistor 216. This reset transistor 216 corresponds to the reset transistor 106 as shown in FIG. 1.

In this case, the second and fourth semiconductor regions 206, 208 may be arranged in an active region different from the active region 201A. However, at this occasion, at least the second semiconductor region 206 needs to be arranged in both of the active region 201A and the another active region, and they need to be connected electrically. Even in the case of arrangement in another active region, the order in which each conduction pattern and each N-type semiconductor region are arranged needs to be the same order in which they are arranged in the same active region.

Subsequently, elements disposed in the active region 201B will be explained.

In the active region 201B, the N-type semiconductor regions 209, 211, 213 are provided. The N-type semiconductor regions 209, 211, 213 are arranged in this order along a direction extending from the upper portion to the lower portion of the drawing (first direction). The conduction patterns 210, 212 are arranged above the active region 201B with the insulating member interposed therebetween. The conduction patterns 210, 212 are arranged in this order along a direction extending from the upper portion to the lower portion of the drawing (first direction). The elements of the active region 201B are shown in a parallel arrangement direction to those of the active region 201A. However, the arrangement is not limited thereto and may be along any given direction.

In the planar view, the N-type semiconductor region 209 (sixth semiconductor region), the conduction pattern 210 (fourth conduction pattern), the N-type semiconductor region 211 (fifth semiconductor region), the conduction pattern 212 (fifth conduction pattern), and the N-type semiconductor region 213 (seventh semiconductor region) are arranged in this order along a direction extending from the upper portion to the lower portion of the drawing (first direction). In this case, a part of each conduction pattern and each N-type semiconductor region may overlap each other in the planar view. However, each conduction pattern and each N-type semiconductor region should not be in such positional relationship that one of them is completely contained in other thereof in the planar view. In the planar view, each conduction pattern and each N-type semiconductor region does not have better other conduction pattern or other N-type semiconductor region disposed therebetween. However, an insulating member and/or a contact plug electrically connected to each N-type semiconductor region may be arranged between each conduction pattern. A P-type semiconductor region may be arranged between each N-type semiconductor region, or an N-type semiconductor region having an impurity concentration lower than that of the N-type semiconductor region may be arranged between the N-type semiconductor regions.

Therefore, in other words, the fourth conduction pattern 210 and the fifth conduction pattern 212 arranged along the first direction are provided above the active region 201B with the insulating member interposed therebetween. The fifth semiconductor region 211 is arranged between the fourth conduction pattern 210 and the fifth conduction pattern 212 in the active region 201B. In addition, the sixth semiconductor region 209 is arranged in the active region opposite to the fifth semiconductor region 211 with the fourth conduction pattern interposed therebetween. The seventh semiconductor region 213 is arranged in the active region 201B opposite to the fifth semiconductor region 211 with the fifth conduction pattern 212 interposed therebetween.

The selection transistor 217 is constituted by the sixth semiconductor region 209, the fourth conduction pattern 210, and the fifth semiconductor region 211. The sixth semiconductor region 209 becomes the source of the selection transistor 217, and the fifth semiconductor region 211 becomes the drain of the selection transistor 217. This selection transistor 217 corresponds to the selection transistor 107 as shown in FIG. 1.

The amplification transistor 218 is constituted by the fifth semiconductor region 211, the fifth conduction pattern 212, and the seventh semiconductor region 213. The fifth semiconductor region 211 becomes the source of the amplification transistor 218, and the seventh semiconductor region 213 becomes the drain of the amplification transistor 218. This amplification transistor 218 corresponds to the amplification transistor 105 as shown in FIG. 1.

Each of the conduction patterns 203, 205, 207, 210, 212 is made of, for example, polysilicon. Further, a part thereof may be made into silicide.

Although each member is in a substantially rectangular shape for the sake of explanation, each configuration need not be made into a substantially rectangular shape. FIG. 3 merely shows a relative positional relationship of each member arranged in the active region 201A when they are seen in the planar view.

Figure 4:
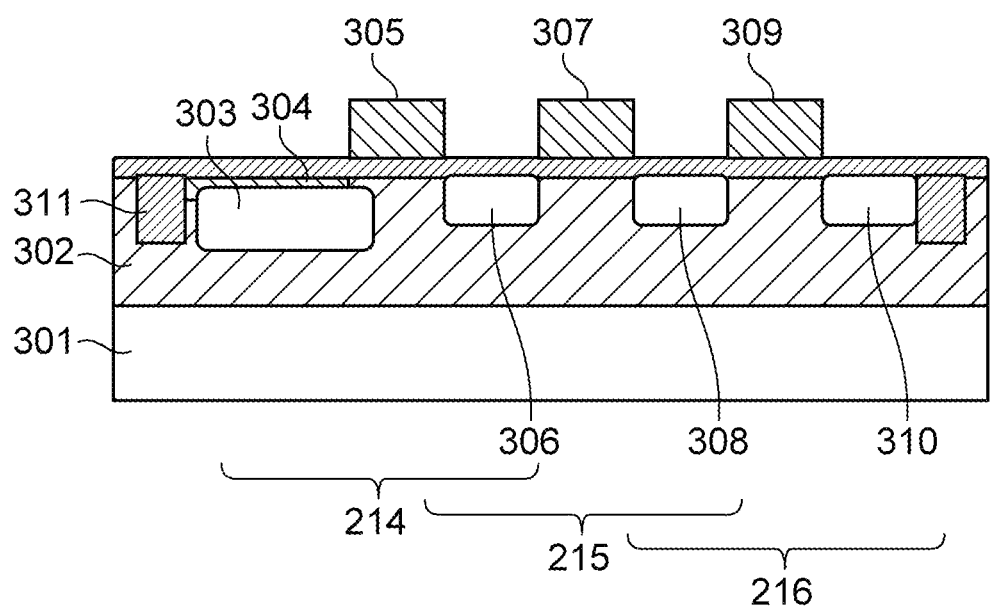
FIG. 4 is cross sectional view schematically illustrating a structure of a cross section taken along line A-A' of FIG. 3 which is the solid-state image pickup device according to the first embodiment.

FIG. 4 is cross sectional view schematically illustrating a structure in a cross section taken along line A-A' of FIG. 3. Portions having the same functions as those in FIG. 3 are denoted with the same reference numerals, and detailed explanation thereof is omitted.

On the semiconductor substrate 301, each element is formed. The semiconductor substrate 301 may be N-type or may be P-type. In this case, an N-type semiconductor substrate is used.

A P-type well 302 is arranged in the semiconductor substrate 301. The P-type well 302 can be formed through ion injection for injecting P-type impurity ion into the semiconductor substrate 301. In this case, the P-type well 302 is indicated as a single region in the drawing. Alternatively, the P-type well 302 may be constituted by multiple semiconductor regions arranged in different depths and each having an impurity concentration peak. Further, a P-type well 302 arranged in a region where a pixel is provided may be configured to be different from a P-type well arranged in a peripheral circuit region. In this case, the peripheral circuit region means a region disposed on the semiconductor substrate 301 and arranged in a peripheral unit of the region where multiple pixels are arranged. This peripheral circuit region is provided with a control circuit for outputting the control pulse pSEL, pRES, pTX, pFDINC and the like explained above. The peripheral circuit region is provided with a circuit for sampling a signal, which is output through the signal line 109 as shown in FIG. 1 from multiple pixels, and outputting the signal to the outside of the semiconductor substrate 301.

The N-type semiconductor region 303 (third semiconductor region) constitutes a PN junction with a portion of the P-type well 302 (the P-type semiconductor region explained above) to form a photo diode. In this case, the N-type semiconductor region 303 is shown as a single region in the drawing. Alternatively, the N-type semiconductor region 303 may be constituted by multiple regions. Further, a portion of the third semiconductor region 303 is arranged to extend to a lower portion of the conduction pattern 305 (first conduction pattern) constituting the gate electrode of the transfer transistor 214 as shown in FIG. 2, so that the transfer efficiency can be improved.

The P-type semiconductor region 304 is a region disposed between the third semiconductor region 303 and the insulating member disposed at the upper portion of the active region in order to suppress a dark current generated at the interface between the insulating member and the semiconductor. By providing the P-type semiconductor region 304, a so-called embedded photo diode can be made.

According to the control pulse provided to the first conduction pattern 305 (the gate of the transfer transistor 214 as shown in FIG. 2), the electron of the third semiconductor region 303 is transferred to the N-type semiconductor region 306 (first semiconductor region).

The first semiconductor region 306 is a floating diffusion region. The first semiconductor region 306 is electrically connected to the gate of an amplification transistor which is not shown. An electrical connection between the first semiconductor region 306 and the gate of the amplification transistor can be made using a contact plug or a metal wire layer which is not shown.

The conduction pattern 307 (second conduction pattern) constitutes a portion of the additional capacitor 215 as shown in FIG. 2. If the second conduction pattern 307 is referred to as the gate of the additional capacitor 215, the state of adding capacitance to the electrical charge holding unit and the state of not adding capacitance to the electrical charge holding unit can be switched according to the control pulse provided to the gate of the additional capacitor 215.

The N-type semiconductor region 308 (second semiconductor region) is the source region of the reset transistor 216, and the N-type semiconductor region 310 (fourth semiconductor region) is the drain region of the reset transistor 216. The conduction pattern 309 (third conduction pattern) is the gate electrode of the reset transistor 216.

The element isolation unit 311 is a region provided to separate the active region 210A from the peripheral elements or the peripheral active region. The element isolation unit 311 may be made by, for example, element isolation formed by LOCOS method, an STI isolation unit, and the like. Further, a high concentration P-type semiconductor region may be provided in a lower portion of the element isolation unit 311.

Hereinafter, a reading mechanism for reading a signal in a pixel will be further explained in details with reference to FIGS. 1 to 4.

As explained above, the electrical charge holding unit 104 is configured to include the first semiconductor region 306 disposed in the semiconductor substrate as explained above. More specifically, the capacitance of the electrical charge holding unit 104 is a total summation (referred to as Ckfd) of not only the PN junction capacitance of the first semiconductor region 306 and the P-type semiconductor region 302 (Cfd) but also the capacitance formed by the first, second conduction patterns 305, 307 and the insulating member formed under them. Therefore, the amount of variation of the size of area of the first semiconductor region 306 in the planar view affects the electrical charge-voltage conversion efficiency of a pixel.

For example, the electrical charge quantity generated by the photo diode 102 is denoted as Qpd, and the voltage amplitude of the gate of the amplification transistor 105 when the transfer transistor 103 transfers the electrical charge quantity Qpd is denoted as Vfd. Vfd is expressed by the expression Vfd=Qpd/Ckfd. More specifically, the electrical charge is converted into a voltage in proportional to the reciprocal number of the capacitance value of the electrical charge holding unit 104. Therefore, for example, when Ckfd is constant, Vfd increases as Qpd increases, and accordingly, the dynamic range of the signal is affected by the capacitance value Ckfd of the electrical charge holding unit. In contrast, if the capacitance value of the additional capacitor 108 is added to the capacitance value of the electrical charge holding unit 104, the dynamic range of the electrical charge holding unit 104 can be expanded.

In this case, the capacitance value of the additional capacitor varies for, e.g., each of the pixels, the electrical charge voltage conversion coefficient explained above varies for each pixel when the additional capacitor is added, and therefore, it is difficult to improve the image quality. An example of variation of this capacitance value includes variation in the size of area of the second semiconductor region 206 constituting a portion of the additional capacitor in the planar view.

For example, if the size of area of the first semiconductor region 204 constituting the electrical charge holding unit is denoted as S, the capacitance value generated by the PN junction of the first semiconductor region 204 can be expressed as C=εS/d. Likewise, if the size of area in the second semiconductor region 206 constituting a portion of the additional capacitor is denoted as SS, the capacitance value can be expressed as C=εSS/d. Therefore, it is understood that the size of area of the second semiconductor region 206 in the planar view gives influence as a parameter for determining the capacitance value of the additional capacitor. If this size of area varies in each pixel, there may be a problem in that the electrical charge voltage conversion efficiency is different for each pixel, or the dynamic range is different when the additional capacitor is added. As a result of further study in details by the inventors of the present application, the inventors have found that the size of area of the second semiconductor region 206 in the planar view varies because of relative variation in the positional relationship during production process.

In this case, the cause of variation in the size of area of the second semiconductor region 206 will be explained with reference to FIGS. 5A to 7B. FIGS. 5A to 5D illustrate an example of a production process flow of a solid-state image pickup device. Portions having the same functions as those in FIGS. 1 to 4 are denoted with the same reference numerals, and detailed explanation thereof is omitted. In FIGS. 5A to 5D, a case where insulating body isolation using LOCOS method is used as an element isolation unit will be used as an example in the explanation.

Figure 5A:
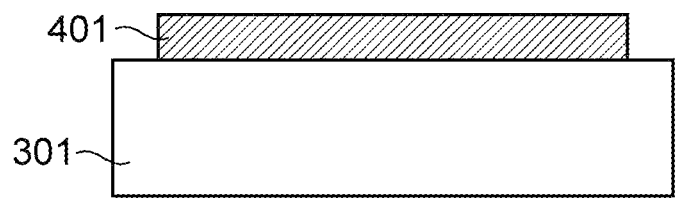
FIGS. 5A to 5E are figures illustrating an example of a production process flow of the solid-state image pickup device.

In FIG. 5A, first, a semiconductor substrate 301 is prepared, and a film 401 is formed on the entire surface on the semiconductor substrate 301. The film 401 may be a single layer or multiple layers. For example, the film 401 may be formed using a stacked film including a silicon oxide film, a polysilicon film, and a silicon nitride film. After the film 401 is formed, all of the film 401 or a portion of the film 401 is patterned so that an aperture is arranged in a region of the film 401 corresponding to a region where the element isolation unit is to be formed. In the patterning at this occasion, first, a photo resist which is not shown is formed on the film 401. Then, an exposure device such as a stepper emits exposure light onto a photo resist. Then, by developing a photo resist, a pattern based on the photo resist can be formed in a predetermined region. By etching the film 401 using this pattern as a mask, the aperture is formed in the film 401.

Figure 5B:
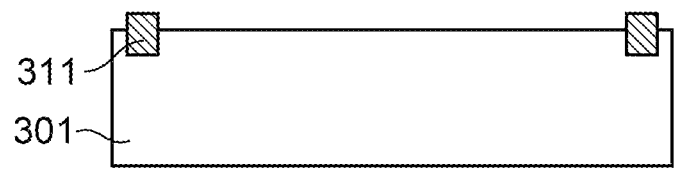

In FIG. 5B, by performing thermal treatment under a predetermined condition, the semiconductor substrate 301 in the aperture portion provided in the insulating body film 401 is oxidized, so that the element isolation unit 311 is formed. In this step, the active region is defined.

Figure 5C:
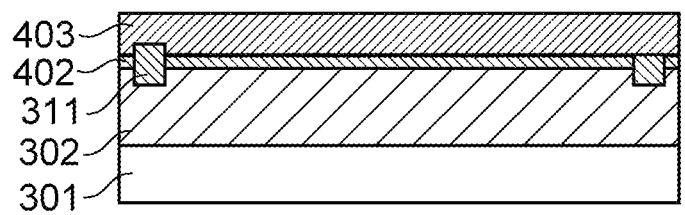

In FIG. 5C, an insulating body film 402 and a polysilicon film 403 are formed on the structure obtained in FIG. 5B. The insulating body film 402 is a film serving as the gate insulating film or a portion of the gate insulating film of each transistor later. The insulating body film 402 may be made of a silicon oxide film, or a silicon nitride film, or a stacked film thereof.

Figure 5D:
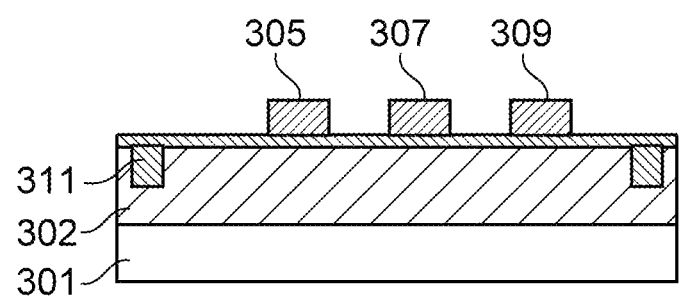

In FIG. 5D, the polysilicon film 403 is patterned, so that the first, second, third conduction patterns 305, 307, 309 are formed. In the patterning performed at this occasion, first, a photo resist which is not shown is formed on the polysilicon film 403. Then, an exposure device such as a stepper emits exposure light onto a photo resist. Then, by developing a photo resist, a pattern based on the photo resist can be formed in a predetermined region. By etching the film 401 using this pattern as a mask, the polysilicon film 403 is patterned, and the conduction patterns 305, 307, 309 are formed.

Figure 5E:
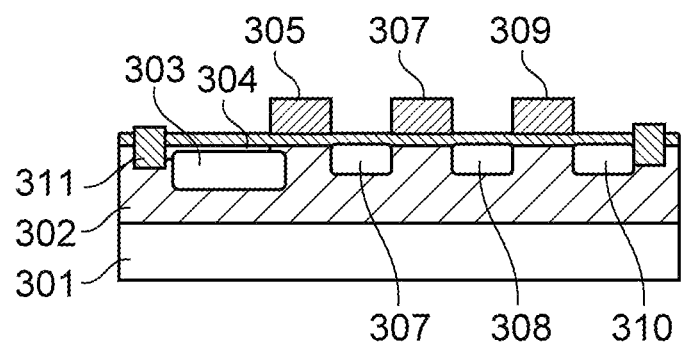

In FIG. 5E, ion injection is performed using the first conduction pattern 305 as a mask, so that the third semiconductor region 303 and the P-type semiconductor region 304 are formed. The third semiconductor region 303 and the P-type semiconductor region 304 are made into a photoelectric conversion unit. At this occasion, a region other than the portion where the photoelectric conversion unit is formed is covered with a photo resist mask which is not shown. Although the third semiconductor region 303 is formed by using the first conduction pattern 305 as the mask and performing ion injection in this case, the third semiconductor region 303 may also be formed by performing ion injection using the photo resist mask before the polysilicon film 403 is formed.

Then, while the photoelectric conversion unit is covered with the photo resist mask, ion injection is performed using the second and third conduction patterns 307, 309 as the mask, so that the first, second, third semiconductor regions 306, 308, 310 are formed in a predetermined region. Therefore, each of the semiconductor regions 306, 308, 310 can be formed so as to reduce the positional deviation for each pixel of the relative position with respect to the conduction patterns 307, 309 in the planar view.

By performing these steps, the cross sectional structure as shown in FIG. 3 can be obtained.

As described above, the step in FIG. 5A for defining the active region and the step in FIG. 5D are executed in the exposure step using the stepper by using the masks (reticles) which are different for each of them. In general, in the exposure step performed using different reticles, an alignment mask is used in order to align the relative positional relationship in the planar view. For example, in the step for defining the active region, an alignment mark is formed, and this alignment mark is used in the step for patterning the polysilicon film, so that the relative positional relationship between the active region and the polysilicon can be aligned in multiple pixels.

However, because of, e.g., lens distortion in the stepper and the like, it is difficult to completely eliminate the relative positional deviation when each member is formed using different reticles, and this causes deviation in the order of several nanometers. It is understood that such a very small deviation which does not cause any problem with an ordinary device may cause problem with the additional capacitor explained above. This becomes more significant problem when the size of the solid-state image pickup device becomes large, and the relative positional deviation becomes further more significant with a so called full size in which the diagonal of the image pickup region is about 35 mm or with a size called APS-H. Alternatively, this becomes particularly significant problem in a case where, e.g., the same exposure step is formed in multiple shots on a single chip using an exposure device such as a stepper, for example, when only a single solid-state image pickup device is obtained from a wafer.

Figure 6A:
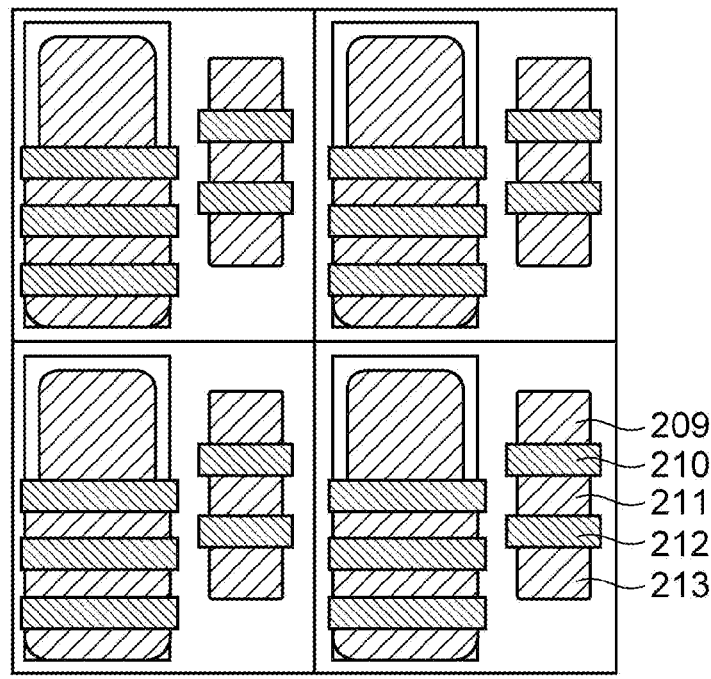
FIGS. 6A and 6B are top views schematically illustrating 2-by-2 pixels which are an example of arrangement of members constituting the solid-state image pickup device.
Figure 6B:
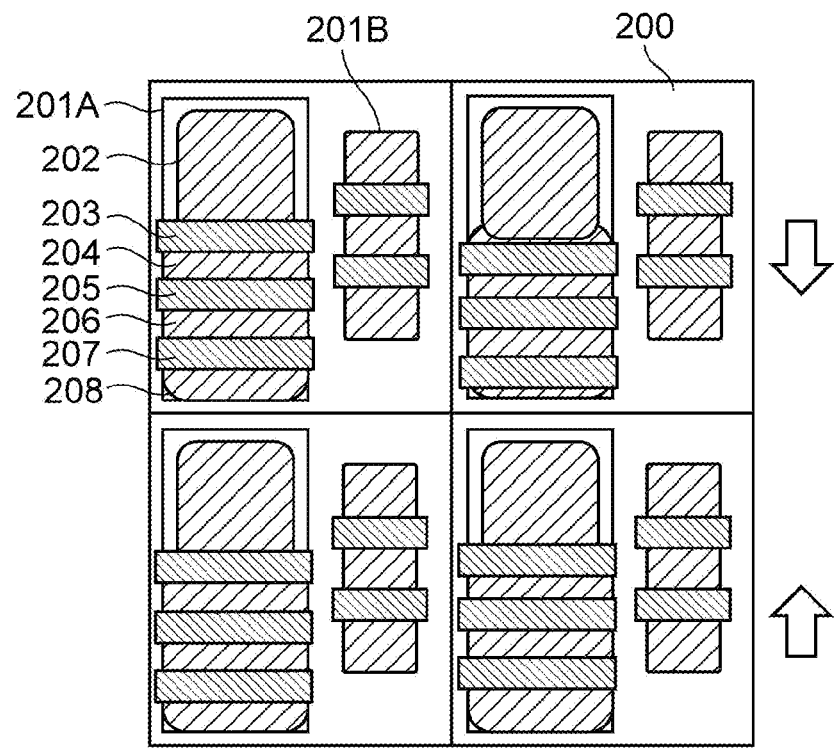
Figure 7A:
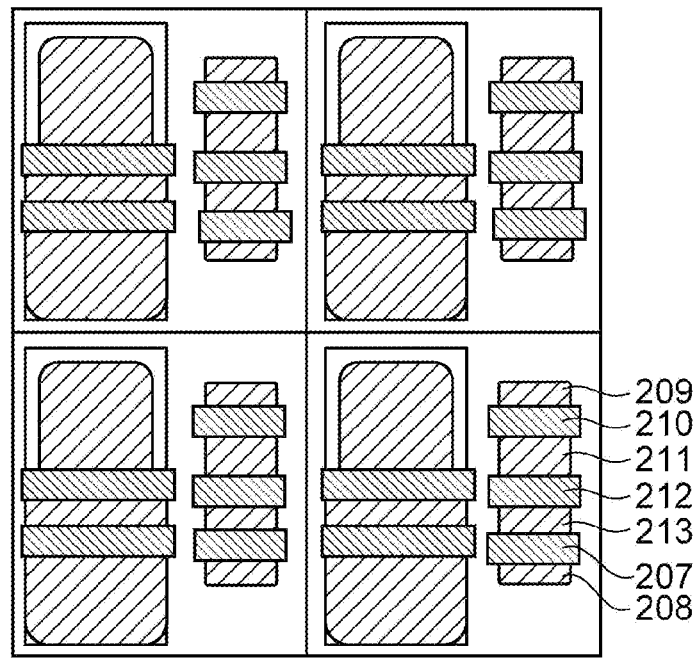
FIGS. 7A and 7B are top views schematically illustrating 2-by-2 pixels which are an example of arrangement of members constituting the solid-state image pickup device according to the conventional technique.
Figure 7B:
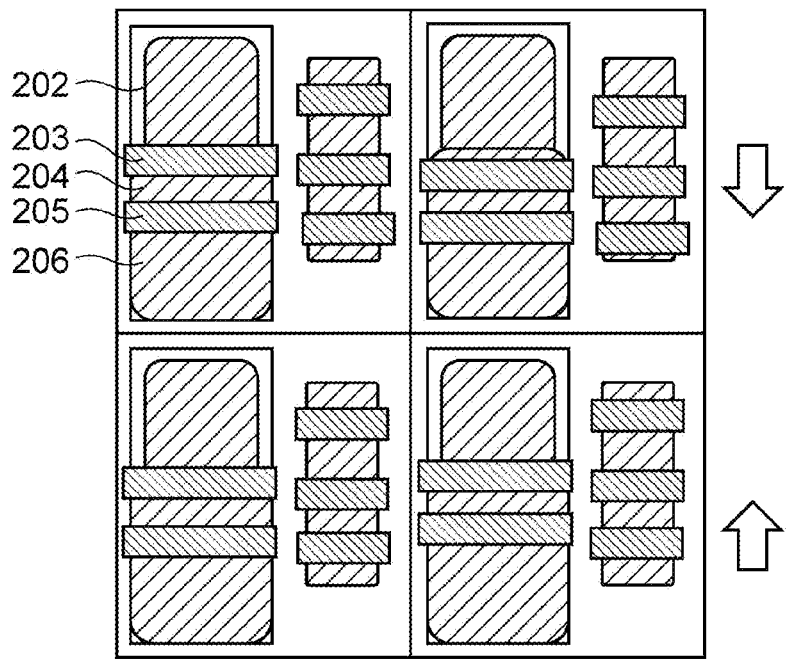

FIGS. 6A and 6B and FIGS. 7A and 7B show an example in which a relative positional relationship is deviated between the active region and the conduction pattern, which is an example of a case where relative positional deviation occurs. FIGS. 6A and 6B and FIGS. 7A and 7B are top views schematically illustrating 2-by-2 pixels as an example of arrangement of members constituting an example of an equivalent circuit of pixels in the solid-state image pickup device as shown in FIG. 1. In this case, portions having the same functions as those in FIG. 2 are denoted with the same reference numerals, and detailed explanation thereof is omitted. FIGS. 6A and 6B illustrate the present embodiment, and FIGS. 7A and 7B illustrate a comparative example.

In FIGS. 6A and 6B, the N-type semiconductor region which becomes the source and the drain of the reset transistor 106 are arranged in the active region 201A. The size of the area of the N-type semiconductor region (second semiconductor region) 206 constituting a portion of the additional capacitor in the planar view is defined by the arrangement of the second conduction pattern 205 and the third conduction pattern 207. In contrast, in FIGS. 7A and 7B, the N-type semiconductor region which becomes the source and the drain of the reset transistor is arranged in the active region 201B which is an active region different from the active region 201A. The second semiconductor region 206 constituting the additional capacitor and the fourth semiconductor region 208 which becomes the source of the reset transistor are electrically connected. In such configuration, the second semiconductor region 206 and the fourth semiconductor region 208 become constituent members of the additional capacitor. At this occasion, the size of area of the second semiconductor region 206 in the planar view is defined by a positional relationship of a border between the second conduction pattern 205 and the active region 201A. The size of area of the fourth semiconductor region 208 in the planar view is defined by the border of the active region 201B and the arrangement of the third conduction pattern 207. With regard to this point, the present embodiment of FIGS. 6A and 6B are different from the comparative example of FIGS. 7A and 7B.

In this case, FIG. 6A and FIG. 7A illustrate an ideal case where there is no deviation in the relative positions of the conduction pattern and the active region. FIG. 6B and FIG. 7B illustrate a case where there is a deviation in the relative positions of the conduction pattern and the active region.

This shows that, in the pixels in a row at the left side of FIG. 6B and FIG. 7B, there is no relative positional deviation, and the conduction pattern of the upper pixels in the right row is deviated to the lower side of the drawing with respect to the active region, and the conduction pattern of the lower pixels in the right row is deviated to the upper side of the drawing with respect to the active region. In reality, such positional relationship does not occur between adjacent pixels. However, for example, this is a phenomenon that is likely to occur in a case of pixels arranged away from each other a long distance, e.g., the end portions which are opposite in the solid-state image pickup device.

In the case of the comparative example as shown in FIGS. 7A and 7B, when there is such a deviation in the relative position between the conduction pattern and the active region, there are changes in the sizes of areas of the second and the fourth semiconductor regions 206, 208 constituting a portion of the additional capacitor, and this may change the capacitance value of the additional capacitor. For example, in the upper pixels of the right row illustrating the case where the conduction pattern is deviated to the lower side of the drawing, the sizes of areas of the second and the fourth semiconductor regions 206, 208 decrease. In the lower pixels of the right row illustrating the case where the conduction pattern is deviated to the upper side of the drawing, the sizes of areas of the second and the fourth semiconductor regions 206, 208 increase.

When there is deviation in the size of area of the N-type semiconductor region constituting a portion of the additional capacitor as described above, the capacitance value of the additional capacitor changes, and when the additional capacitor is used, the electrical charge voltage conversion efficiency changes for each pixel.

In contrast, according to the configuration of the present embodiment as shown in FIGS. 6A and 6B, the size of area of the second semiconductor region 206 constituting a portion of the additional capacitor is defined by the arrangement of the second conduction pattern 205 and the third conduction pattern 207, which is evident by referring to FIG. 6B. Therefore, even if there is a deviation in the relative positional relationship between the conduction pattern and the active region, the amount of change in the size of area of the second semiconductor region 206 is smaller than FIGS. 7A and 7B since the deviation of the sizes of areas of the conduction patterns is smaller. Therefore, according to the present embodiment, even if there is a deviation in the relative positional relationship between the conduction pattern and the active region, the amount of change in the capacitance value added by the additional capacitor for each pixel is small.

As described above, according to the present embodiment, even if there is a deviation in the relative positional relationship between the conduction pattern and the active region, the change in the size of area of the N-type semiconductor region constituting a portion of the additional capacitor can be suppressed. For this reason, this can reduce variation of the capacitance value of the additional capacitor can be reduced. Accordingly, the variation in electrical charge voltage conversion efficiency for each pixel can be alleviated, and the image quality can be improved.

Second Embodiment

Figure 8:
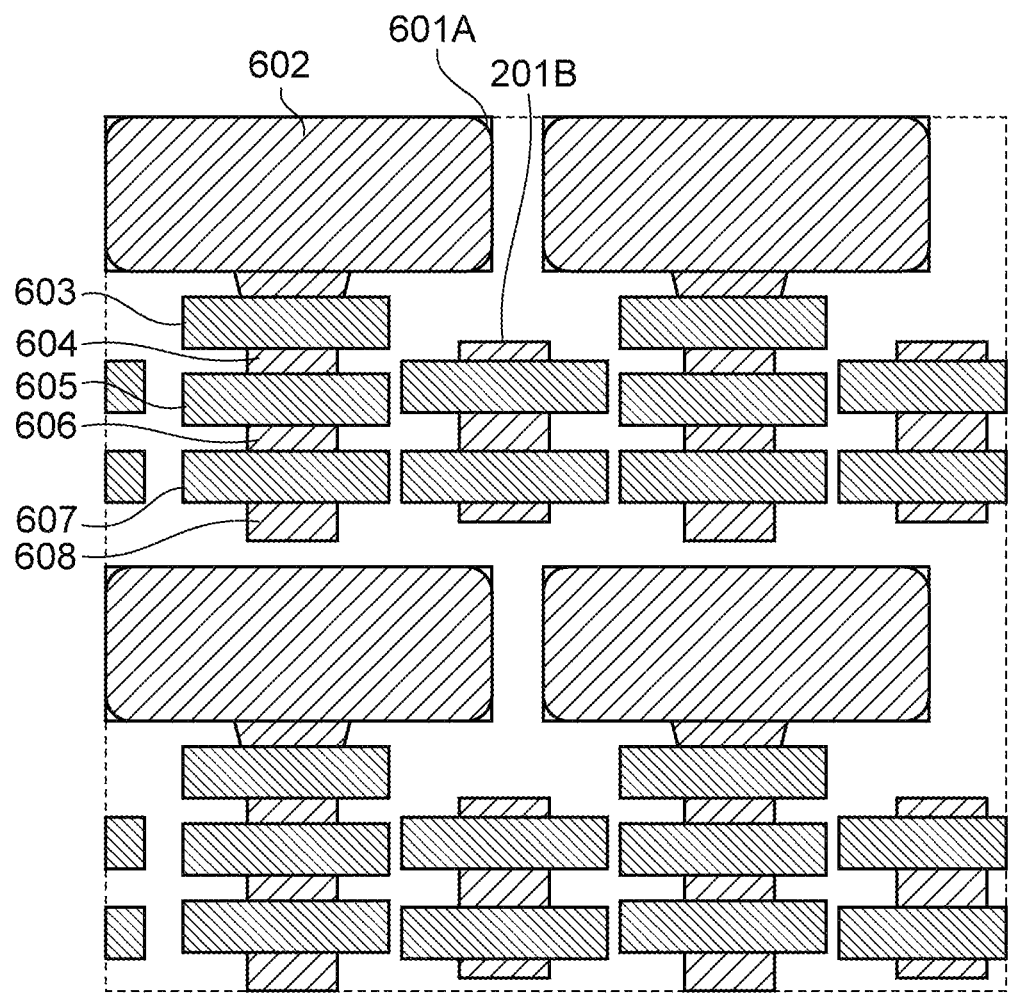
FIG. 8 is a top view schematically illustrating an example of arrangement of members constituting a pixel of a solid-state image pickup device according to a second embodiment.

FIG. 8 is a top view schematically illustrating an example of arrangement of members constituting pixels of the solid-state image pickup device according to the present embodiment. Portions having the same functions as the first embodiment are denoted with the same reference numerals, and detailed explanation thereof is omitted.

The present embodiment is different from the first embodiment in the shape of the active region in the planar view. In the first embodiment, in the planar view, the shape of the active region in which the transfer transistor, the additional capacitor, and the reset transistor are disposed is substantially rectangular. In contrast, in the present embodiment, the width of the active region in which the photoelectric conversion unit is disposed in the planar view is wider than the width of the active region where other elements are disposed. In this case, the width of the active region means the width in a direction parallel to the channel width of the transfer transistor of the active region 601A. This width is smaller at the side of the N-type semiconductor region 604 (first semiconductor region) constituting the floating diffusion region is smaller than at the side of the N-type semiconductor region 602 (third semiconductor region) constituting the photoelectric conversion unit.

Further, the region between the floating diffusion region and the photoelectric conversion unit of the active region 601A is more preferably in a tapered shape. This is because, with this shape, the signal electrical charge generated by the photoelectric conversion unit is likely to be transferred to the floating diffusion region without failure when the transfer transistor is turned ON. At the side of the floating diffusion region, the width of the active region can be reduced, and therefore, the capacitance value of the electrical charge holding unit can be reduced, and the electrical charge voltage conversion efficiency can be improved. In this case, the tapered shape is configured such that the width in a direction parallel to the channel width of the transfer transistor becomes narrower continuously or in a stepwise manner in a region of an active region 601A extending from a third semiconductor region 602 to a first semiconductor region 604 with a conduction pattern 603 (first conduction pattern) interposed therebetween.

As shown in FIG. 8, in the planar view, a third semiconductor region 602, a first conduction pattern 603, a first semiconductor region 604, a conduction pattern 605 (second conduction pattern), and an N-type semiconductor region 606 (second semiconductor region) are arranged in this order along a direction in which the active region 601A extends form the upper portion to the lower portion of the drawing (first direction). Further, a conduction pattern 607 (third conduction pattern) constituting the gate of the reset transistor and an N-type semiconductor region 608 (fourth semiconductor region) constituting the drain of the reset transistor are arranged in this order. The order of the positions thereof is like the first embodiment.

Although, as described above, the active region between the photoelectric conversion unit and the floating diffusion region is in the tapered shape, the border between the element isolation unit and the region of the active region overlapping the first conduction pattern 603 in a planar manner is preferably in a direction parallel to the first direction. With such shape, even if the relative positional relationship of the first conduction pattern 603 with respect to the active region is deviated, the rate of change in the size of area of the first semiconductor region 604 in the planar view becomes constant, and the amount of deviation in the size of area is reduced.

The same effects as the first embodiment can also be obtained from the present embodiment, and further, the transfer efficiency of electrical charge from the photoelectric conversion unit can be improved. In addition, the capacitance value of the electrical charge holding unit can be reduced, and therefore, the electrical charge voltage conversion efficiency can be improved in the electrical charge holding unit.

Third Embodiment

Figure 9:
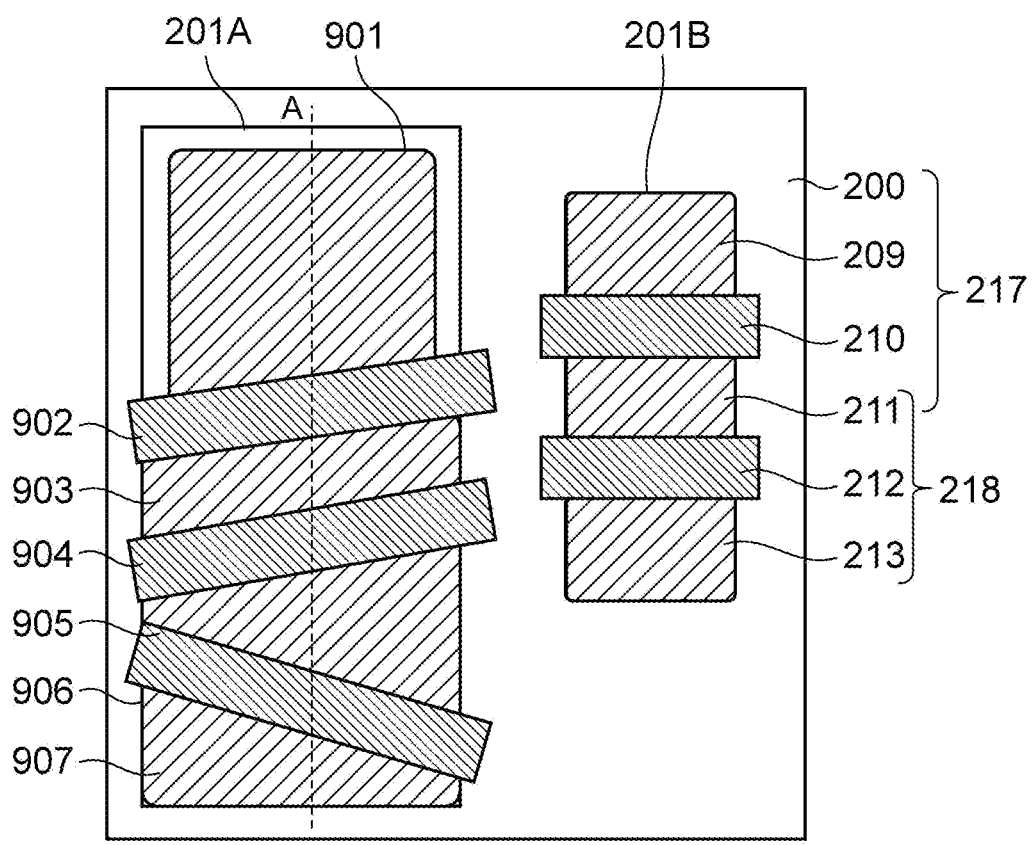
FIG. 9 is a top view schematically illustrating an example of arrangement of members constituting a pixel of a solid-state image pickup device according to a third embodiment.

FIG. 9 is a top view schematically illustrating an example of arrangement of members constituting a pixel of the solid-state image pickup device according to the present embodiment. Portions having the same functions as the first and second embodiments are denoted with the same reference numerals, and detailed explanation thereof is omitted.

The present embodiment is different from the first and second embodiments in the shape of the conduction pattern in the planar view. While the conduction patterns are arranged in parallel to each other in the first and second embodiments, a set of conduction patterns parallel to each other and a set of conduction patterns not parallel to each other exist in a mixed manner in the present embodiment. Further, while the conduction pattern and the active region are perpendicular to each other in the planar view in the first and second embodiments, the conduction pattern and the active region cross each other at an angle that is not 90 degrees in the planar view in the present embodiment.

In the present embodiment, as shown in FIG. 9, an N-type semiconductor region 901 (third semiconductor region), a conduction pattern 902 (first conduction pattern), and an N-type semiconductor region 903 (first semiconductor region) are also arranged along the first direction of the active region 201A. Further, a conduction pattern 904 (second conduction pattern) constituting a part of the additional capacitor and an N-type semiconductor region 905 (second semiconductor region) constituting a part of the additional capacitor are arranged. Further, a conduction pattern 906 (third conduction pattern) constituting the gate of the reset transistor and an N-type semiconductor region 907 (fourth semiconductor region) constituting the drain of the reset transistor are arranged in this order.

According to the present embodiment, the amount change of the size of area of the second semiconductor region 905 caused by the relative positional relationship between the conduction pattern and the active region is also small, and therefore, the same effects as those of the first and second embodiments can be obtained.

Fourth Embodiment

Figure 10:
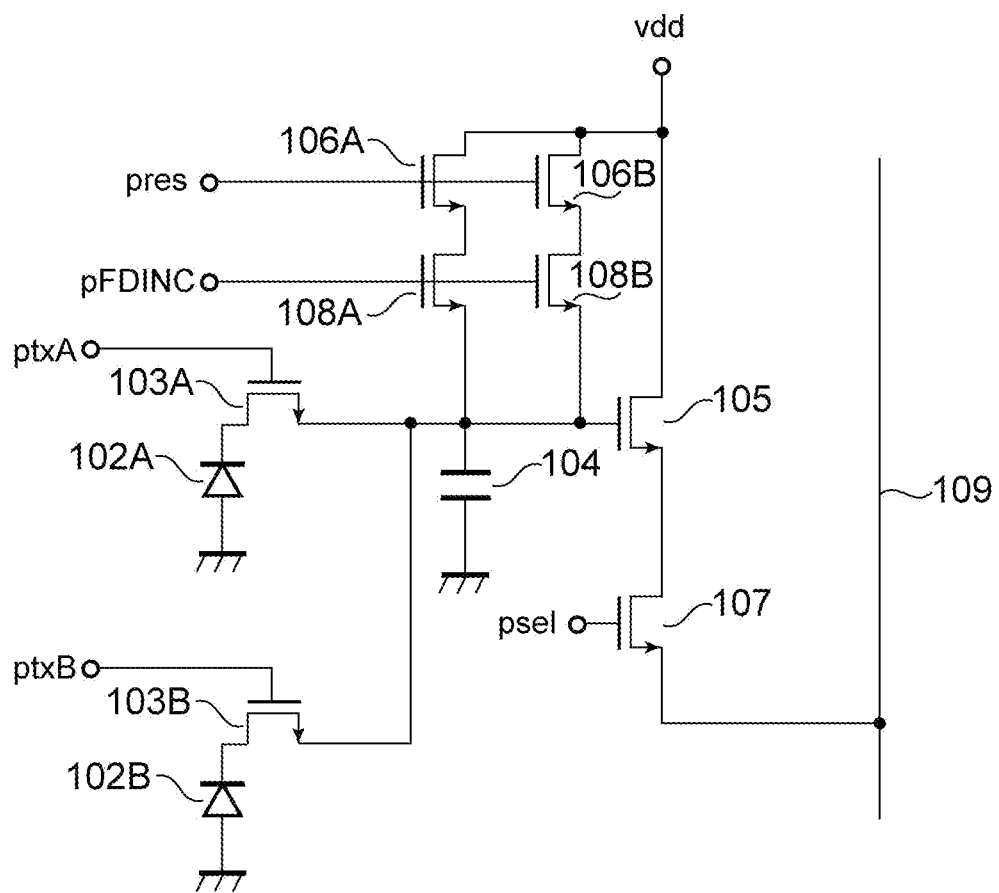
FIG. 10 is an example of an equivalent circuit diagram of a pixel of a solid-state image pickup device according to a fourth embodiment.
Figure 11A:
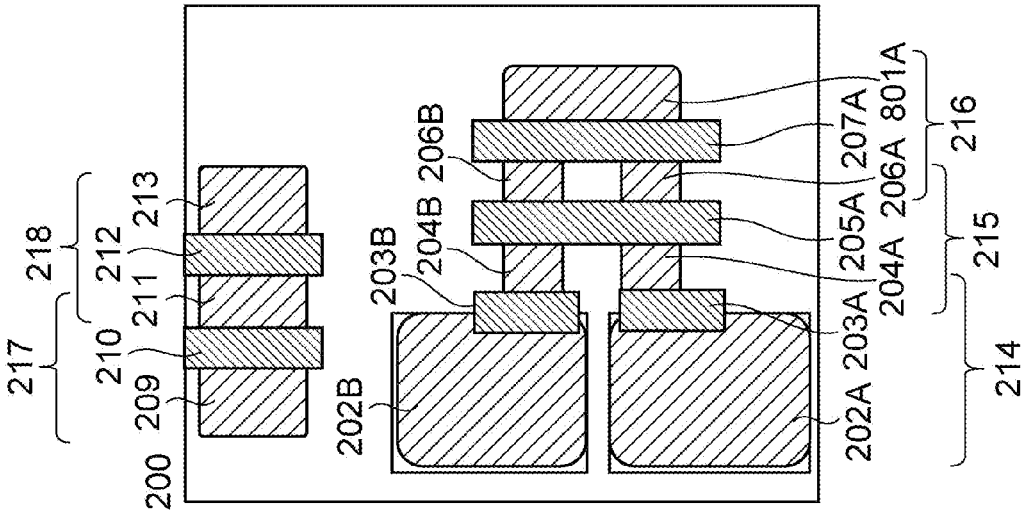
FIGS. 11A and 11B are top views schematically illustrating an example arrangement of members constituting a pixel of the solid-state image pickup device according to the fourth embodiment.
Figure 11B:
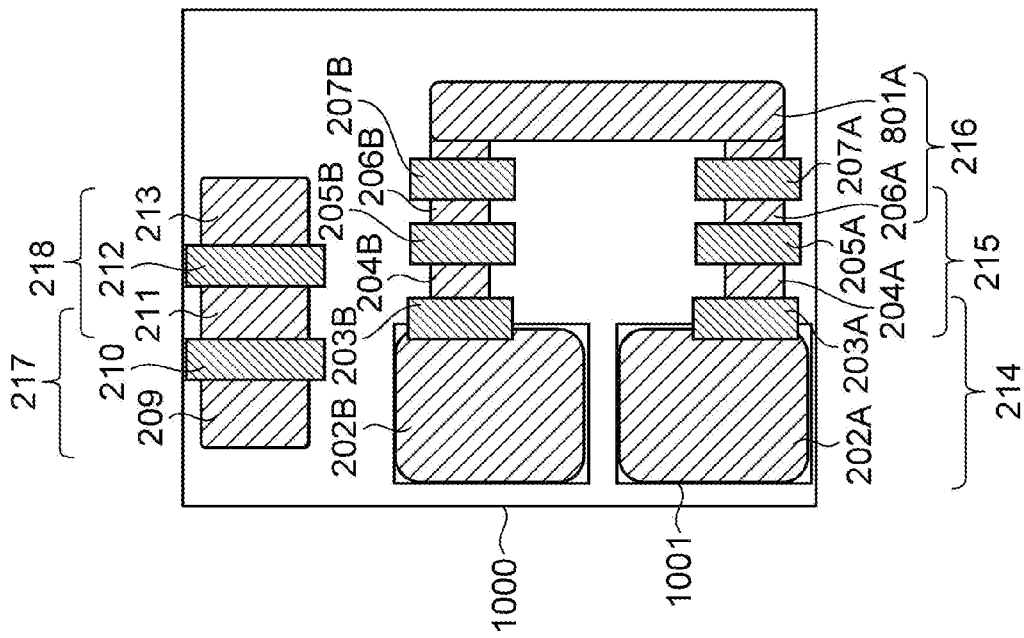

FIG. 10 is an equivalent circuit diagram of a pixel according to the present embodiment. FIGS. 11A and 11B are top views schematically illustrating an example of arrangement of members constituting a pixel of a solid-state image pickup device according to the present embodiment. Portions having the same functions as those in the first to the third embodiments are denoted with the same reference numerals, and detailed explanation thereof is omitted. The present embodiment is different from the first to the third embodiments in that: while a single pixel amplification unit is provided in association with a single photoelectric conversion unit in the first to the third embodiments; a pixel amplification unit is shared by multiple photoelectric conversion units in the present embodiment. More specifically, in the present embodiment, a single pixel amplification unit is provided for two photoelectric conversion units.

In the explanation about the present embodiment, elements and members having subscripts after reference numerals have similar functions, and this explains that they are provided in association with each pixel or photoelectric conversion unit. When a common function is explained, a reference numeral without any subscript is used for explanation, and when operation and the like are different, they are explained with a subscript attached thereto. In this case, members of which reference numeral except a subscript is the same as that of FIG. 3 denote the same member as that of the first embodiment.

FIG. 10 explains an equivalent circuit of the present embodiment. In the following explanation, the difference from the first to the third embodiments will be mainly explained. In FIG. 10, signals based on electrons generated by the photo diodes 102A, 102B are amplified by the amplification transistor 105, and are output via the selection transistor 107 to the signal line 109. A control pulse pTXA is provided to the gate of the transfer transistor 103A, and a control pulse pTXB is provided to the gate of the transfer transistor 103B. The conduction timings of these control pulses pTXA, pTXB are provided being shifted with each other, so that the signals generated by the photo diodes 102A, 102B can be independently read out.

Although the present embodiment has a configuration in which pRES which is the control pulse common to the gates of the reset transistors 106A, 106B is provided, it may also have a configuration in which independent control pulses are provided to each of them. Any one of the reset transistors 106A, 106B or both of the reset transistors 106A, 106B set(s) the potential of the input node of the amplification transistor 105 shared by multiple photo diodes 102A, 102B to a predetermined potential.

Further, similarly, a configuration may be adopted in which the common control pulse pFDINC is provided to the gates constituting the additional capacitors 108A, 108B. Alternatively, a configuration may be adopted in which independent control pulses are provided to each of them. When the configuration is adopted in which independent control pulses are provided, the capacitance value added to the electrical charge holding unit 104 can be switched to multiple levels. Further, the capacitance value added to each photoelectric conversion unit can be switched, and therefore, the reading mode can be switched for each pixel or each photoelectric conversion unit. In a case of use with a color sensor, the added capacitance value may be switched for each color.

FIGS. 11A and 11B explains a schematic top view of a pixel of the solid-state image pickup device according to the present embodiment. In the following explanation, the difference from the first to the third embodiments will be mainly explained. In the present embodiment, two N-type semiconductor regions 202A, 202B (third semiconductor regions) constituting two photo diodes 102A, 102B and an N-type semiconductor region constituting a transfer transistor, a reset transistor, and an additional capacitor provided associated therewith are provided in a single active region 1001.

In FIG. 11A, conduction patterns constituting the gate electrodes of the reset transistors are provided as conduction patterns 207A, 207B in association with the photo diodes 102A, 102B and electrically isolated therefrom. Further, in FIG. 11A, in association with the photo diodes 102A, 102B, conduction patterns constituting the gate electrodes of the additional capacitors are provided as conduction patterns 205A, 205B in such a manner that they are electrically independent from each other. Channels are respectively formed in active regions of lower portions of the conduction patterns 207A, 207B constituting the gates of the reset transistors. An element isolation unit 1000 is provided between these multiple channels. The N-type semiconductor region 801A (fourth semiconductor region) is commonly provided as the drains of the two reset transistors.

In contrast, in FIG. 11B, the conduction pattern 207 constituting the gate electrode of the reset transistor is made of a single conduction pattern. Further, FIG. 11B is different from FIG. 11A in that the conduction pattern 205 constituting the additional capacitor is also made of a single conduction pattern in FIG. 11B. In this case, a configuration made of a single conduction pattern means a configuration in which a conduction pattern is continuously arranged on an element isolation unit disposed between a reset transistor and another reset transistor so as to extend from the upper portion of the channel of the reset transistor to the upper portion of the channel of the another reset transistor.

Further, in the configuration of FIG. 11B, the first semiconductor regions 204 serving as the floating diffusion regions may be a common semiconductor region. The second semiconductor regions 206 serving as the source regions of the reset transistors may be a common semiconductor region. Further, in a configuration as shown in FIG. 11B, a conduction pattern is common to two pixels, and therefore, the active regions are preferably arranged as close to each other as possible. Therefore, as shown in FIG. 11B, a portion of the active region having the floating diffusion region and the like arranged therein provided in association with each of the photo diodes 102A, 102B may extend from a portion close to each photo diode.

Even if there is a deviation in the relative positional relationship between the conduction pattern and the active region in the present embodiment like the first to the third embodiments, the amount of change in the second semiconductor region 206 constituting the additional capacitor 108 can be reduced. For this reason, this can reduce the amount of change in the summation of capacitance values when the additional capacitors are added to the electrical charge holding units 104. Accordingly, gain variation in the electrical charge to voltage gain for each pixel can be reduced, and the quality of image can be improved. Further, the pixel amplification unit can be shared by multiple pixels, and therefore, the number of elements per pixel can be reduced, and the ratio of aperture of the photo diode can be improved.

Fifth Embodiment

Figure 12:
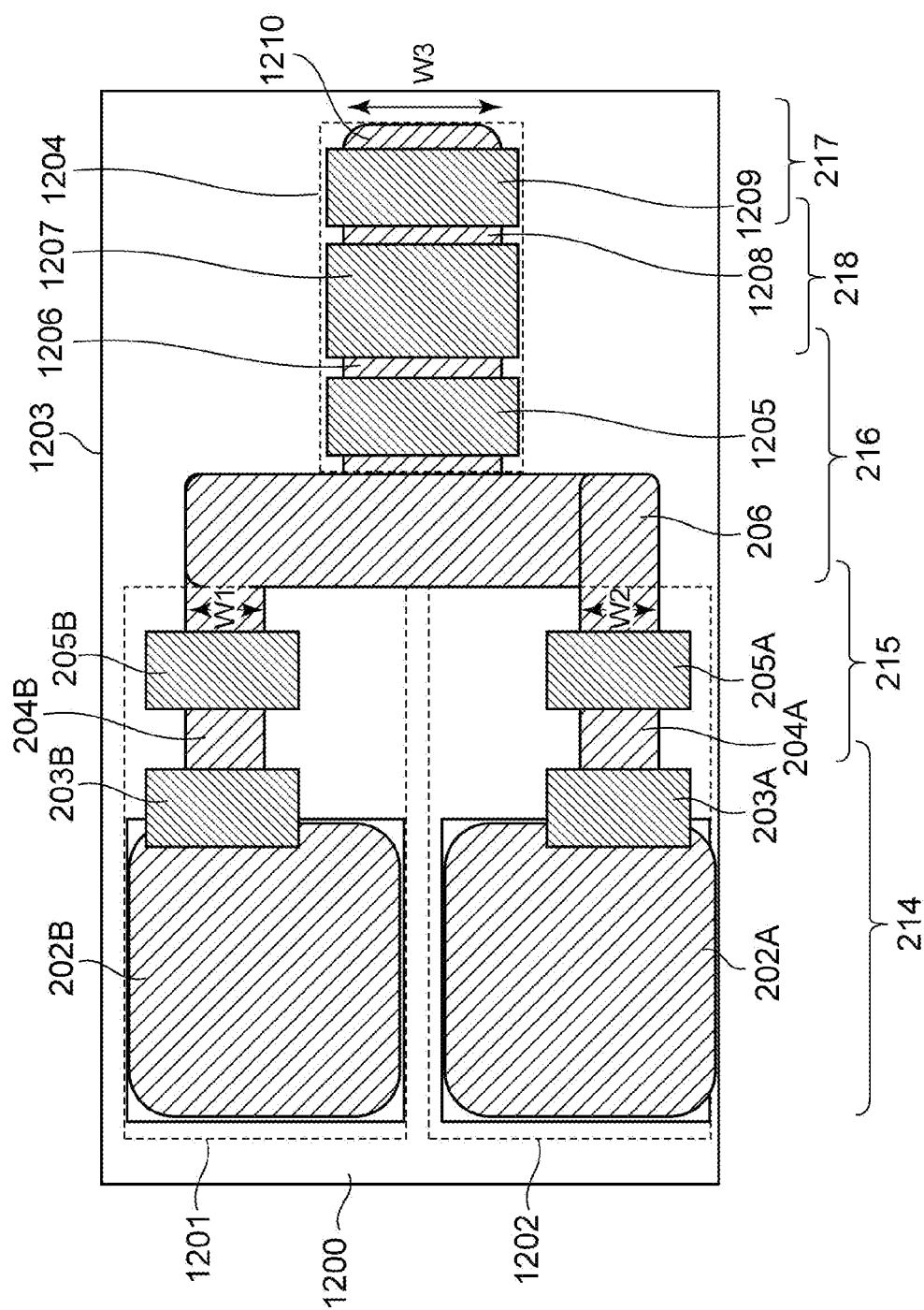
FIG. 12 is a top view schematically illustrating an example of arrangement of members constituting a pixel of a solid-state image pickup device according to a fifth embodiment.

FIG. 12 is a top view schematically illustrating an example of arrangement of members constituting a pixel of a solid-state image pickup device according to the present embodiment. Portions having the same functions as those in the first to the fourth embodiments are denoted with the same reference numerals, and detailed explanation thereof is omitted. The present embodiment may be deemed as a modification of the fourth embodiment, and the equivalent circuit is shown in FIG. 10 as the fourth embodiment. The present embodiment is different from the fourth embodiment in that: while the pixel amplification unit and the selection unit are provided in an active region different from the active region where the photoelectric conversion unit and the like are disposed in the fourth embodiment, they are arranged in the same active region in the present embodiment.

In FIG. 12 a single active region is divided into a first portion 1201, a second portion 1202, a third portion 1203, and a fourth portion 1204 for the sake of explanation.

An N-type semiconductor region 202A (third semiconductor region) constituting a photo diode 102A as shown in FIG. 10, an N-type semiconductor region 204A (first semiconductor region) constituting a floating diffusion region, and a portion of an N-type semiconductor region 206 (second semiconductor region) which becomes the source region of the reset transistor are arranged in the first portion 1201.

An N-type semiconductor region 202B (third semiconductor region) which becomes a photo diode 102B as shown in FIG. 10, an N-type semiconductor region 204B (first semiconductor region) which becomes a floating diffusion region, and a portion of an N-type semiconductor region 206 which becomes the source region of the reset transistor are arranged in the second portion 1202.

A portion of the N-type semiconductor region 206 (second semiconductor region) which becomes the source region of the reset transistor is arranged in the third portion 1203.

Another portion of the second semiconductor region 206 which becomes the source region of the reset transistor and an N-type semiconductor region 1206 (fourth semiconductor region) which becomes the drain region of the reset transistor are arranged in a fourth portion 1204. Further, an N-type semiconductor region 1208 (fifth semiconductor region) which becomes the source region of the amplification transistor and an N-type semiconductor region 1210 (sixth semiconductor region) which becomes the source region of the selection transistor are arranged. Conduction patterns 1205, 1207, and 1209 are arranged above the fourth portion with an insulating body film interposed therebetween, and the conduction patterns 1205, 1207, and 1209 become the gate electrodes of the reset transistor, the amplification transistor, and the selection transistor, respectively.

An element isolation unit 1200 is disposed between the first portion 1201 and the second portion 1202. The first portion 1201 and the second portion 1202 are connected to the third portion 1203, and further, the fourth portion 1204 extends from a portion of the third portion 1203.

A width W3 of the fourth portion 1204 is wider than a width W1 of the first portion 1201 and a width W2 of the second portion 1202. Further, it is preferable to satisfy the following relationship.

$$0.9 \times (W1 + W2) \leq W3 \leq 1.1 \times (W1 + W2) \quad \text{(Expression 1)}$$

In this case, the width of each active region is a length in a direction parallel to the channel width direction of each transistor.

This is because, arguendo, a difference decreases between an amount of reduction in the size of area of the second semiconductor region 206 caused by the deviation of the conduction patterns 205A, 205B to the right side of the drawing with respect to the active region and an amount of reduction in the size of area of the second semiconductor region 206 caused by the deviation of the conduction pattern 1205. As a result, this reduces variation between the capacitance value of the additional capacitor for each pixel.

(Modification being Common to the Embodiments)

Each of the above embodiments has explained the example in which the N-type semiconductor region constituting the reset transistor is arranged in the active region provided with the N-type semiconductor region constituting the photoelectric conversion unit and the additional capacitor, and the conduction pattern constituting the elements thereof are provided in the upper portion thereof.

However, even with an element other than the reset transistor, there is a modification achieving the same effects as each of the embodiments explained above. More specifically, this is a configuration such that, instead of the reset transistor in each of the above embodiments explained above, a conduction pattern is provided that receives a voltage not formed with any channel in the active region in the lower portion of the conduction pattern when the additional capacitor is connected to the input node. The same effects can also be obtained when such conduction pattern is provided instead of the conduction pattern constituting the gate electrode of the reset transistor. An example of such element includes a second additional capacitor and the like capable of switching the additional capacitor value to multiple levels.

Although the disclosure has been specifically explained hereinabove using the embodiments, the disclosure can be configured such that these embodiments are changed or combined as necessary without deviating from the gist of the disclosure. For example, in each of the embodiments, for example, only the example in which the additional capacitor is constituted by a single conduction pattern and two N-type semiconductor regions has been shown. However, in addition, a capacitor electrically connected to one of the N-type semiconductor regions may be provided separately. A specific example of such capacitor includes a capacitor configured to include conduction patterns stacked with an insulating member interposed therebetween.

(Example of Image Pickup System)

A solid-state image pickup device according to one embodiment can be applied to various purposes. For example, the solid-state image pickup device can be applied to an image pickup sensor for a digital single-lens reflex camera, an image pickup sensor for a digital video camera, or an image pickup sensor for a cellular telephone. These applied devices include an optical member for condensing light onto an image pickup surface of the solid-state image pickup device and a control unit for switching a connection state and a non-connection state of the additional capacitor of the solid-state image pickup device, so that the image pickup system can be made.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2014-016021, filed Jan. 30, 2014, which is hereby incorporated by reference herein in its entirety.

What is claimed is:

1. A solid-state image pickup device comprising a plurality of pixels, each pixel including:
a photoelectric conversion unit;
an amplification transistor;
a transfer transistor configured to transfer a signal of the photoelectric conversion unit to an input node of the amplification transistor;
an additional capacitor configured to switch connection state and non-connection state for the input node; and
a reset transistor configured to set a potential of the input node to a predetermined potential,
wherein each of the pixels includes a third semiconductor region, a first semiconductor region, a second semiconductor region, and a fourth semiconductor region of a same conduction type arranged in this order along a first direction in an active region provided in a semiconductor substrate, and a first conduction pattern, a second conduction pattern, and a third conduction pattern provided above an active region in this order along the first direction,
the first semiconductor region, the first conduction pattern, and the third semiconductor region constitute the transfer transistor,
the first semiconductor region, the second conduction pattern, and the second semiconductor region constitute the additional capacitor, and
the second semiconductor region, the third conduction pattern, and the fourth semiconductor region constitute the reset transistor.

2. The solid-state image pickup device according to claim 1, wherein the amplification transistor is shared by a plurality of photoelectric conversion units.

3. The solid-state image pickup device according to claim 2, wherein a plurality of first conduction patterns constituting gates of transfer transistors provided respectively in association with a plurality of photoelectric conversion units sharing the amplification transistor are electrically isolated from each other.

4. The solid-state image pickup device according to claim 2, wherein the reset transistor configured to set a potential of an input node of the shared amplification transistor to a predetermined potential has a plurality of channels provided with an element isolation unit interposed therebetween.

5. The solid-state image pickup device according to claim 4, wherein the plurality of third conduction patterns electrically isolated from each other with the element isolation unit interposed therebetween are arranged on the plurality of channels.

6. The solid-state image pickup device according to claim 2, comprising a plurality of additional capacitors provided respectively in association with the plurality of photoelectric conversion units configured to amplify a signal with the shared amplification transistor, wherein the second conduction patterns constituting the gates of the additional capacitors are electrically isolated from each other.

7. The solid-state image pickup device according to claim 2, comprising a plurality of additional capacitors provided respectively in association with the plurality of photoelectric conversion units configured to amplify a signal with the shared amplification transistor, wherein the second conduction patterns constituting the gates of the additional capacitors are constituted by a single conduction pattern.

8. The solid-state image pickup device according to claim 1, wherein a source region and a drain region of the amplification transistor are arranged in another active region provided with an element isolation unit between the active region and the another active region.

9. The solid-state image pickup device according to claim 1, wherein each of plural semiconductor regions of a same conduction-type each constituting a source and a drain of the amplification transistor are provided in the active region.

10. The solid-state image pickup device according to claim 1, wherein each pixel includes a selection transistor configured to control an electric conduction between the amplification transistor and a signal line, and
each of plural semiconductor regions of a same conduction-type each constituting a source and a drain of the selection transistor are provided in the active region.

11. The solid-state image pickup device according to claim 9, wherein a length in a direction parallel to a channel width direction of the reset transistor in an active region in a lower portion of the third conduction pattern is longer than lengths in a direction perpendicular to a direction extending from the first semiconductor region to the second semiconductor region in an active region in a lower portion of the second conduction pattern.

12. The solid-state image pickup device according to claim 11, wherein when the length in the direction parallel to the channel width direction of the reset transistor in the active region in the lower portion of the third conduction pattern is denoted as W1, and the lengths in the direction in the direction perpendicular to the direction extending from the first semiconductor region to the second semiconductor region in an active region in the lower portion of the second conduction pattern are denoted as W2, W3, the following expression is satisfied $$0.9 \times (W1+W2) \leq W3.$$

13. The solid-state image pickup device according to claim 12, wherein the following expression is further satisfied $$0.9 \times (W1+W2) \leq W3 \leq 1.1 \times (W1+W2).$$

14. The solid-state image pickup device according to claim 1, wherein each of the first conduction pattern, the second conduction pattern, and the third conduction pattern is arranged in parallel to the active region.

15. The solid-state image pickup device according to claim 1, wherein the first conduction pattern, the second conduction pattern, and the third conduction pattern are perpendicular to the active region.

16. The solid-state image pickup device according to claim 1, wherein a width in a direction parallel to a channel width of the transfer transistor in the active region with the first conduction pattern interposed therebetween is smaller at a side of the first semiconductor region than at a side of the third semiconductor region.

17. The solid-state image pickup device according to claim 16, wherein the width in the direction parallel to the channel width of the transfer transistor in a region of the active region extending from the third semiconductor region to the first semiconductor region with the first conduction pattern interposed therebetween becomes narrower continuously or in a stepwise manner.

18. The solid-state image pickup device according to claim 1,
wherein the second semiconductor region is electrically connected to a capacitor configured to include the second conduction pattern stacked with an insulating member interposed therebetween.

19. An image pickup system comprising:
the solid-state image pickup device according to claim 1;
an optical member configured to condense light on an image pickup surface of the solid-state image pickup device; and
a control unit configured to switch a connection state and a non-connection state of the additional capacitor of the solid-state image pickup device.

20. A solid-state image pickup device comprising a plurality of pixels, each pixel including:
a photoelectric conversion unit;
an amplification transistor;
a transfer transistor configured to transfer a signal of the photoelectric conversion unit to an input node of the amplification transistor; and
an additional capacitor configured to switch connection state and non-connection state for the input node,
wherein each of the pixels includes a third semiconductor region, a first semiconductor region, and a second semiconductor region of a same conduction type arranged in this order along a first direction in an active region provided in a semiconductor substrate, and a first conduction pattern, a second conduction pattern, and a third conduction pattern provided above an active region in this order along the first direction,
the first semiconductor region, the first conduction pattern, and the third semiconductor region constitute the transfer transistor,
the first semiconductor region, the second conduction pattern, and the second semiconductor region constitute the additional capacitor, and
the third conduction pattern receives a voltage not forming a channel in an active region in a lower portion of the third conduction pattern when the additional capacitor is connected to the input node.

* * * * *